United States Patent

Gontowski, Jr.

[11] 4,147,996
[45] Apr. 3, 1979

[54] CURRENT-CONTROLLED OSCILLATOR

[75] Inventor: Walter S. Gontowski, Jr., Thompson, Conn.

[73] Assignee: Sprague Electric Company, North Adams, Mass.

[21] Appl. No.: 894,304

[22] Filed: Apr. 7, 1978

[51] Int. Cl.² .................................... H03K 3/282
[52] U.S. Cl. .............................. 331/111; 331/108 A
[58] Field of Search ............... 331/111, 143, 108 A; 307/288

[56] References Cited

U.S. PATENT DOCUMENTS

| 3,718,870 | 2/1973 | Keller | 331/108 A |
| 3,886,485 | 5/1975 | Takahashi | 331/111 |
| 4,001,723 | 1/1977 | Sheng | 331/111 |

Primary Examiner—John Kominski
Attorney, Agent, or Firm—Connolly and Hutz

[57] ABSTRACT

A pulsing oscillator employs a capacitor that is charged through a diode from a current-source circuit and repeatedly discharges through a PNP and an NPN transistor when the capacitor voltage reaches a predetermined voltage. Another transistor is connected in shunt with a diode and capacitor, and is turned on only when the first mentioned transistors turn on so as to divert the frequency controlling current from the current source away from the capacitor during the time of discharge. The output pulse width remains constant for all values of control current and large control currents may be used without risking the "latching-on" by large control currents of the transistors intended to carry the discharge current from the capacitor.

6 Claims, 3 Drawing Figures

CURRENT-CONTROLLED OSCILLATOR

BACKGROUND OF THE INVENTION

This invention is related to a current-controlled oscillator and more particularly to an oscillator capable of reliable operation when large amplitude control currents are employed. A well known pulsing oscillator circuit employs a series circuit, including a capacitor and a resistor, which circuit is connected across a d.c. voltage. A transistor switch is provided to repeatedly discharge the capacitor when it reaches a predetermined voltage. The frequency of oscillation is typically varied by varying the value of the resistor.

It is an object of this invention to provide a low cost integrated circuit oscillator, the output frequency of which is a function of a control current.

It is a further object of this invention to provide a pulsing oscillator wherein the output pulses are a constant width and independent of the magnitude of the control current.

SUMMARY OF THE INVENTION

A current-controlled oscillator is comprised of a first bipolar transistor of one polarity type and a second bipolar transistor of the other polarity type, which are interconnected by having a collector of the first connected to the base of the second and a collector of the second connected to the base of the first. The collector of the second transistor is connected at an intermediate point in a resistive voltage divider network which network is connected across two d.c. power supply busses. The emitter of the second transistor is connected to one of the busses. A capacitor is connected between the emitters of the first and second transistors. A variable current source has an output connected, in the forward biased direction through a diode, to the emitter of the first transistor.

When a d.c. voltage is applied across the busses in a polarity tending to turn on the first and second transistors, the circuit thus far described is capable of oscillating as a consequence of the current from the current source repeatedly charging the capacitor until the first and second transistors turn on and discharge it.

The oscillator of this invention additionally comprises a current gating means for shunting the output current from the current-source around the diode and capacitor when the first transistor is conducting which occurs only during the time of capacitor discharge. By this means, the output current from the current-source may vary over a wide range without influencing the time required to discharge the capacitor. Also the time period between discharge periods is linear with respect to the magnitude of the controlling output current.

DESCRIPTION OF THE PREFERRED EMBODIMENTS

Figure 1:
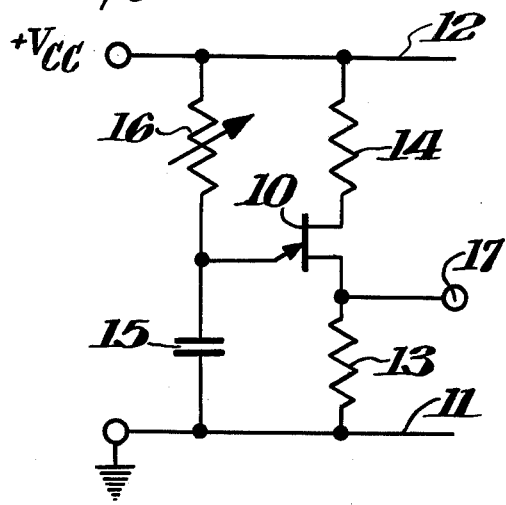
FIG. 1 shows a unijunction oscillator of the prior art.

The oscillator of the prior art illustrated by the diagram of FIG. 1 includes a unijunction transistor 10 having one base connected to one d.c. voltage supply buss 11 and the other base connected to the other d.c. voltage supply buss 12, through resistors 13 and 14, respectively. A capacitor 15 is connected between the emitter of the transistor 10 and the one buss 11. A variable resistor 16 is connected between the emitter of the transistor 10 and the other d.c. buss 12. When the buss 12 is made positive with respect to buss 11, the capacitor at the first instant has zero charge and zero voltage so that the emitter of transistor 10 is back biased with respect to the base and no current flows in the emitter.

The capacitor charges through resistor 16 until the capacitor reaches the value necessary to forward bias the emitter of the transistor at which time the capacitor discharges through transistor 10 and resistor 13. The voltage across the capacitor 15 is thus reduced to a point below the "turn on" voltage of transistor 10 and proceeds to charge again through resistor 16. This action thenceforth occurs repeatedly at a rate that is determined in part by the R × C time constant of capacitor 15 and resistor 16. When the resistance of resistor 16 is varied, the frequency of capacitor discharges is also changed. This produces a train of discharge voltage pulses across resistor 13 detectable at output terminal 17.

Figure 2:
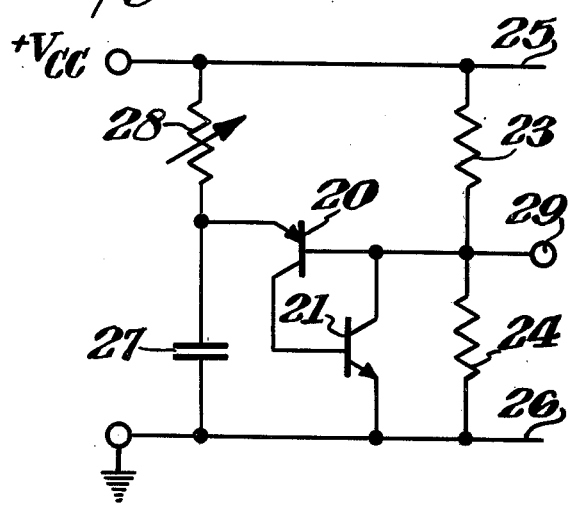
FIG. 2 shows another oscillator of the prior art.

The oscillator of FIG. 2 is known as the functional equivalent of the oscillator of FIG. 1. The collector of the PNP transistor 20 is connected to the base of the NPN transistor 21 while the collector of transistor 21 is connected to the base of transistor 20. The collector of transistor 21 is also connected to a voltage divider resistor network consisting of resistors 23 and 24, which network is connected across the two d.c. voltage power supply busses 25 and 26.

A capacitor 27 is connected between the emitter of transistor 20 and the grounded buss 26. A variable resistor 28 is connected between the emitter of transistor 20 and the positive d.c. power buss 25. When the capacitor 27 charges to a more positive voltage than that appearing at the output terminal 29, transistor 20 turns on, causing transistor 21 to turn on also and thereby discharging the capacitor 27 through the two transistors. A train of negative going voltage pulses consequently appears at terminal 29 having a frequency that is inversely proportional to the R × C time constant of the network consisting of resistor 28 and capacitor 27.

Figure 3:
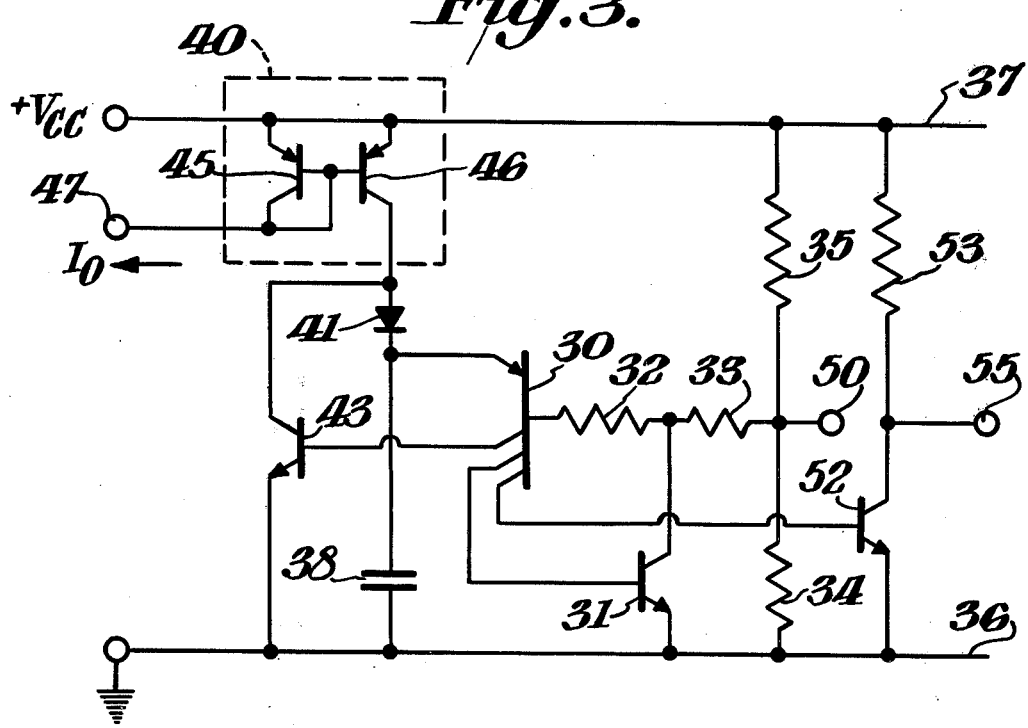
FIG. 3 shows an oscillator of this invention.

An oscillator of this invention is shown in FIG. 3. This oscillator includes a multi-collector PNP transistor 30, one of the collectors being connected to the base of a NPN transistor 31. The base of transistor 30 is connected to the collector of transistor 31 through a current limiting resistor 32. The collector of transistor 31 is also connected to a voltage divider resistor network consisting of resistors 33, 34 and 35, which network is connected across the two d.c. voltage power supply busses 36 and 37.

A capacitor 38 is connected between the emitter of transistor 30 and the grounded buss 36. A high impedance current source 40 is connected to the emitter of transistor 30 through a forward biased diode 41. An NPN transistor 43 is connected, collector to emitter, across the series combination of the diode 41 and capacitor 38 while the base of transistor 43 is connected to another collector of transistor 30.

The current source 40 consists of two transistors 45 and 46 that are connected in a conventional current-mirror circuit configuration. When a current $I_o$ is introduced at terminal 47 and flows through the then forward biased diode-connected transistor 45, a current of proportional amplitude is "mirrored" in the collector of transistor 46 and flows through diode 41 and capacitor 38. The capacitor 38 charges linearly at a rate that is directly proportional to the magnitude of $I_o$.

The current source 40 is connected through the diode 41 so that the output current is in the direction to charge the capacitor in the polarity tending to forward bias the base-emitter junction of transistor 30. When the capacitor voltage reaches a value greater than the d.c. voltage appearing at terminal 50 plus the base-emitter voltage (about 0.7 volts) of transistor 30, then transistor 30 turns on, causing transistor 31 to turn on. The capacitor 38 then discharges mainly through the emitter-base junction of transistor 30, the current limiting resistor 32, and the transistor 31 from collector to emitter.

The time required for this discharge will be determined essentially by the product of the values of the capacitor 38 and the resistor 32. During this discharge period the transistor 43 is turned on, diverting the current from the current source 40 away from the capacitor 38. Thus the diode 41 is back-biased and not conducting during this discharge period so that the discharge period itself is not affected by the particular magnitude of control current, $I_o$, that may be flowing at the time.

This feature is advantageous for applications wherein it is desired to maintain the same discharge duration and therefore the output pulse width (at terminal 50 or 55) over the entire range of output frequencies. Without the current diverting action of transistor 43, the capacitor charging current from current source 40 would continue to flow in that capacitor causing the duration of the discharge to increase. This increase would be most pronounced for largest values of the control current, $I_o$. The diode 41 prevents, during discharge of the capacitor, any of the capacitor discharge current from being diverted through the transistor 43, which is turned on during this period.

Thus the duty factor, the ratio of the discharge pulse width to the period of oscillation, tends to be lower at the higher oscillation frequencies than for a conventional pulsing oscillator wherein the discharge pulse width becomes progressively broader as the control current increases and the frequency increases. This constant pulse width feature makes possible a greater spectrum of current-controlled oscillation frequencies in an oscillator of the invention.

This circuit offers another important advantage over current controlled oscillators of the prior art, namely that larger value control currents may be used without the possibility of "latching" in the on condition of the transistors 30 and 31. This hazzard is eliminated completely in the oscillator of the present invention, illustrated in FIG. 3, since substantially all of the control current is diverted away from the emitter of transistor 30 during the period in each cycle when the capacitor 38 is discharging. This in turn permits the use of relatively low value resistors in the control-current-source circuit (not shown), which low value resistors are more easily and cheaply integrated in the same silicon wafer that contains the oscillator. An oscillator of this invention was incorporated into an integrated silicon circuit (except for the charging capacitor) for use in an intrusion alarm that would produce a siren-like sound.

When it is desired to prevent the load (not shown), which may be connected to terminal 50, from affecting the frequency of oscillations, it may be isolated from the oscillator by an isolation stage consisting of a transistor 52. The emitter of transistor 52 is connected to ground buss 36, the collector is connected to the buss 37 through resistor 53 and the isolated output terminal 55 is connected to the collector of transistor 52. The load may then be connected to output terminal 55 and any variation therein will not influence either the pulse widths or the frequency of the output pulse train.

This current-controlled oscillator is well suited for incorporation in a silicon integrated circuit except that it may be advantageous to employ a discrete capacitor (38) when the desired capacitance value leads to uneconomic use of silicon substrate surface area by an integrated capacitor design.

What is claimed is:

1. A current-controlled oscillator comprising a first bipolar transistor of one polarity type; a second bipolar transistor of the other polarity type, one collector of said first transistor being connected to the base of said second transistor; the collector of said second transistor being connected to the base of said first transistor; a capacitor being connected between the emitters of said first and second transistors; a pair of d.c. voltage busses; a resistive voltage divider means being connected across said busses for establishing an intermediate d.c. voltage at said collector of said second transistor with respect to said busses, said emitter of said second transistor being connected to one of said busses; a diode; a variable current source having an output connected in the forward biased direction through said diode to said emitter of said first transistor; and a current gating means for shunting the output current from said current source around said diode and said capacitor when said first transistor is conducting.

2. The oscillator of claim 1 wherein said current gating means consists of a third bipolar transistor of said other polarity type being connected collector to emitter across the series combination of said diode and said capacitor, respectively, the base of said third transistor being connected to another collector of said first transistor.

3. The oscillator of claim 1 wherein said variable current source is a current-mirror circuit being comprised of a reference-current transistor and an output transistor, both of said one polarity type, having their base-emitter junctions connected in parallel and having their emitters connected to the other of said busses, whereby a frequency determining control current may be introduced into the collector of said reference-current transistor.

4. The oscillator of claim 1 additionally comprising an output buffer stage comprising a bipolar transistor of said other polarity type having a base connected to another collector of said first transistor, an emitter connected to said one buss whereby a load impedance may be connected to the collector of said buffer transistor that is isolated from the frequency determining circuit portions of said oscillator.

5. The oscillator of claim 1 additionally comprising a current limiting resistor that is connected from said second transistor collector to said first transistor base to effect said connection therebetween.

6. The oscillator of claim 1 wherein said transitors, said diode, said divider means and said current gating means are incorporated in a silicon integrated circuit.

* * * * *